United States Patent [19]
Taneya et al.

[11] Patent Number: 5,654,557
[45] Date of Patent: Aug. 5, 1997

[54] QUANTUM WIRE STRUCTURE AND A METHOD FOR PRODUCING THE SAME

[75] Inventors: Mototaka Taneya; Hiroaki Kudo; Satoshi Sugahara; Haruhisa Takiguchi, all of Nara, Japan

[73] Assignees: Sharp Kabushiki Kaisha, Osaka; Optoelectronics Technology Research Laboratory, Tokyo, both of Japan

[21] Appl. No.: 249,051

[22] Filed: May 25, 1994

Related U.S. Application Data

[63] Continuation of Ser. No. 858,123, Mar. 26, 1992.

[30] Foreign Application Priority Data

Mar. 28, 1991 [JP] Japan .................. 3-064322

[51] Int. Cl.$^6$ ............................ H01L 27/12; H01L 45/00
[52] U.S. Cl. ........................... 257/14; 257/17; 257/23
[58] Field of Search ......................... 257/14, 15, 17, 257/16, 22, 23

[56] References Cited

U.S. PATENT DOCUMENTS 4,974,036  11/1990  Kapon ........................... 257/14

OTHER PUBLICATIONS

Dzurko, K.M., et al., "Temperture engineered growth of lowthreshold quantum well lasers by metalorganic chemical vapor deposition" *Appl. Phys. Lett.* (1989) 54(2):105–107.

*Physics and Applications of Semiconductor Superlattice*, "Application of Superlattice II" (Nov. 10, 1984) pp. 210–211.

Turco et al., *Journal of Crystal Growth* (1990) 104(4):766–772.

Miller et al., *Applied Physics Letters* (1989) 54(2): 188–190.

K. Kojima et al., *Extended Abstract 36th Spring Meeting 1989 The Japan Society of Applied Physics and the Related Society*, entitled "Measurement of the Quansi–Quantum–Well Wire Effect in Single Quantum Wells on Gratings", pp. 975.

E. Kapon et al., *Appl. Phys. Lett.* (25 Dec. 1989) 55(26):2715–2717.

Primary Examiner—Donald Monin
Attorney, Agent, or Firm—Morrison & Foerster

[57] ABSTRACT

A quantum wire structure includes a first layer having a thickness sufficiently smaller than a de Broglie wavelength of an electron wave in a medium, a second layer and a third layer which are disposed on and under the first layer and respectively have a forbidden band width larger than that of the first layer, wherein the first layer has a region with a relatively small curvature and a region with a relatively large curvature in its cross-section, and a width of the region with a relatively small curvature is 50 nm or less.

18 Claims, 2 Drawing Sheets

QUANTUM WIRE STRUCTURE AND A METHOD FOR PRODUCING THE SAME

This application is a continuation, of application Ser. No. 07/858,123 filed Mar. 26, 1992.

BACKGROUND OF THE INVENTION

1. Field of the Invention

The present invention relates to a quantum wire structure and a method for producing the same, and more particularly, to a curved electron waveguide structure and a method for producing the same for confining an electron wave by a curve of a quantum well.

2. Description of the Prior Art

Desired characteristics such as increases in luminous efficiency, electron running speed, and electro-optical non-linear effect have been verified as quantum effects in a quantum well structure. Such a structure in which these effects can be expected is a quantum wire structure. In a quantum wire structure, the movement of electrons ordinarily restricted in a two-dimensional direction is further regulated in an additional dimensional direction due to the quantum well structure, thereby realizing a one-dimensional electron gas condition.

Up until now, various kinds of methods for realizing the quantum wire structure have been proposed. Examples of these include a method for growing crystals on an off-substrate using a characteristic that crystals are likely to grow in an atom layer step by Metal Organic Chemical Vapor Deposition (MOCVD) or a molecular beam epitaxial (MBE) method, and a method using an ion injection. However, highly desirable quantum wire effects cannot be achieved even when these methods are used.

As a result, the growth of a quantum well on a patterned substrate has been studied as a method having higher controllability (see Japanese Laid-open Patent Publication No. 2-237110). According to this method, a quantum well layer is grown on a substrate having unevenness in a stripe shape, whereby electrons are confined in a wire-shaped portion having a low potential formed in the unevenness. The advantages of this method are as follows:

(1) It is not necessarily required to develop processing technique on the order of 10 nm which is size of the quantum wire itself; and (2) since the quantum wire structure can be produced by one crystal Growth, it is possible that the contamination of crystal defects is minimized, etc.

However, according to this method, the crystal growth rate in the unevenness is different from that on the flat portion and is varied in accordance with the shape of the unevenness. As a result, it is almost impossible that a quantum wire is produced with satisfactory controllability, in-plane uniformity, and reproducibility as designed. In the same Way, when an optical waveguide is formed by utilizing a curve in growing crystals, reproducibility and controllability cannot be obtained.

As is described above, in the past, it has been difficult to produce a quantum wire structure with satisfactory controllability, reproducibility, and in-plane uniformity. Therefore, various improvements of characteristics which are logically expected in various devices have not yet been achieved.

SUMMARY OF THE INVENTION

The quantum wire structure of this invention, which overcomes the above-discussed and numerous other disadvantages and deficiencies of the prior art, comprises a first layer having a thickness sufficiently smaller than a de Broglie wavelength of an electron wave in a medium, a second layer and a third layer which are disposed on and under the first layer and respectively have a forbidden band width larger than that of the first layer, wherein the first layer has a region with a relatively small curvature and a region with a relatively large curvature in its cross-section, and a width of the region with a relatively small curvature is 50 nm or less.

In a preferred embodiment, a radius of curvature of the region with a relatively small curvature is 200 nm or more.

In a preferred embodiment, a radius of curvature of the region with a relatively large curvature is 50 nm or less.

A method for producing a quantum wire structure on a substrate is provided, the quantum wire structure comprising a first layer having a thickness sufficiently smaller than a de Broglie wavelength of an electron wave in a medium, a second layer and a third layer which are disposed on and under the first layer and respectively have a forbidden band width larger than that of the first layer, wherein a region with a relatively small curvature and a region with a relatively large curvature are successively formed on a face of the substrate on which the quantum wire structure is formed, and a width of the region with a relatively small curvature is 50 nm or less.

A method for producing a quantum wire structure comprises the steps of: forming an unevenness on a surface of a substrate; forming a lower barrier layer on said unevenness; forming a quantum wire layer on said lower barrier layer, said quantum wire layer having a thickness smaller than a de Broglie wavelength of an electron in a medium; forming a upper barrier layer on said quantum wire layer, said upper barrier layer and said lower barrier layer having a forbidden band with larger than that of first layer; and wherein said unevenness is formed to effect a first region in said quantum wire layer having a relatively small radius of curvature in its cross-section on the order of said de Broglie wavelength and a second region with at least one of a substantially flat cross section and a relatively large radius of curvature in cross section.

Thus, the invention described herein makes possible the objective of providing a quantum wire structure, and method for producing the same, which can be produced with satisfactory controllability, reproducibility, and in-plane uniformity.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
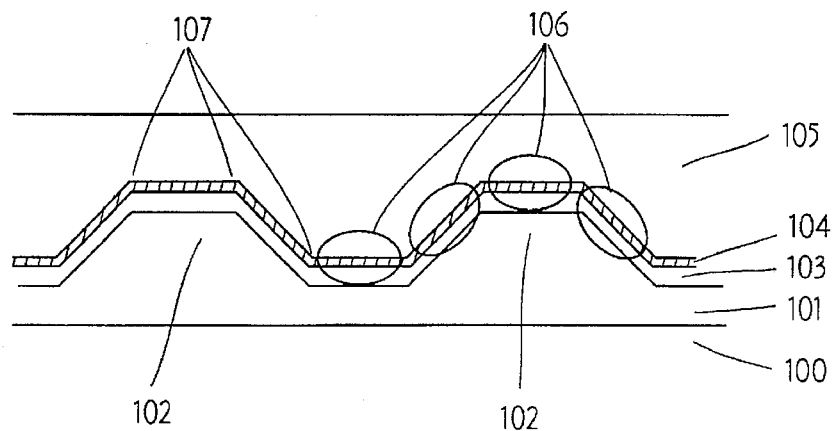
FIG. 1 is a cross-sectional view showing the first example of a quantum wire structure according to the present invention.

Hereinafter, the present invention will be described by way of examples with reference to the drawings, wherein like reference numerals are used to refer to like elements throughout.

EXAMPLE 1

FIG. 1 is a cross-sectional view showing the first example of a quantum wire structure, observed from a face crossing in a wire direction. First, an AlGaAs buffer layer 101 is grown on a GaAs substrate 100 to a thickness of 1 μm. Then, a mesa stripe-shaped (grating-shaped) unevenness 102 having a height of 15 nm, a width of 20 nm, and a period of 70 nm is formed on the AlGaAs buffer layer 101 by electron beam lithography and etching. An AlGaAs lower barrier layer 103 having a thickness of 100 nm, a GaAs quantum wire layer 104 having a thickness of 6 nm, and an AlGaAs upper barrier layer 105 having a thickness of 1 μm are then successively grown by the MOCVD method.

In a wafer thus produced, the GaAs quantum wire layer 104 is grown in accordance with a corresponding shape of the unevenness 102, such unevenness 102 being periodical in the exemplary embodiment. Since the thickness of the GaAs quantum wire layer 104 is 6 nm and sufficiently smaller than that of the de Broglie wavelength of an electron wave (about 50 nm), an electron wave is partially exuded from the GaAs quantum wire layer 104. In order to obtain such a condition, the thickness of the GaAs quantum wire layer 104 is preferably less than 10 nm. The electron wave under this condition is similar to an optical wave confined in an active layer of a semiconductor laser. That is, it is understood that the distribution of a potential of the electron is similar to that of an equivalent index of refraction of the optical wave.

The GaAs quantum wire layer 104 in the present example comprises flat portions 106 having a width of about 20 nm and curved portions 107 disposed therebetween as shown in FIG. 1. Since the thickness of the GaAs quantum wire layer 104 is smaller than the de Broglie wavelength of the electron wave (about 50 nm), the electron is confined because of the difference in a forbidden band width between the AlGaAs lower and upper barrier layers 103 and 105 and the GaAs quantum wire layer 104, when considered in a layer thickness direction. Moreover, when considered in a lateral direction, the electron is confined in the flat portions 106 because of the curved portions 107. This is because the electron wave cannot follow the steep curved portions 107 and is directly exuded into the AlGaAs lower and upper barrier layers 103 and 105, whereby the electron is substantially influenced by the AlGaAs lower and upper barrier layers 103 and 105 having a large forbidden band width.

In order for the electron wave to substantially exude into the AlGaAs lower and upper barrier layers 103 and 105 at the curved portions 107, it is required that the dimension of the GaAs quantum wire layer 104 in the area of the curved portions 107 be sufficiently smaller than the de Broglie wavelength of the electron wave. Because of this, according to the present invention, it is preferred that the thickness of the GaAs quantum wire layer 104 be 10 nm or less, which is sufficiently smaller than the de Broglie wavelength. Moreover, the radius of curvature of the curved portions 107 preferably is similar to or less than that of the de Broglie wavelength of the electron wave (i.e., 50 nm or less). In the present example, the thickness of the GaAs quantum wire layer 104 is 6 nm, and the radius of curvature of the curved portions 107 is approximately 30 nm.

The energy level of the electron confined in the quantum wire (corresponding to the flat portions 106) thus produced is determined by the types of materials used for the quantum wire layer 104 and the barrier layers 103 and 105, the thickness of the quantum wire layer 104, and the width of the flat portions 106. These parameters can be controlled with satisfactory controllability and reproducibility in the steps of the crystal growth and minute processing. In addition, the in-plane uniformity can also be improved to a sufficiently practical level by optimizing the process conditions. Thus, in the quantum wire structure produced according to the present invention, an electron having an energy level as designed can be obtained with satisfactory controllability, reproducibility, and in-plane uniformity.

EXAMPLE 2

Figure 2:
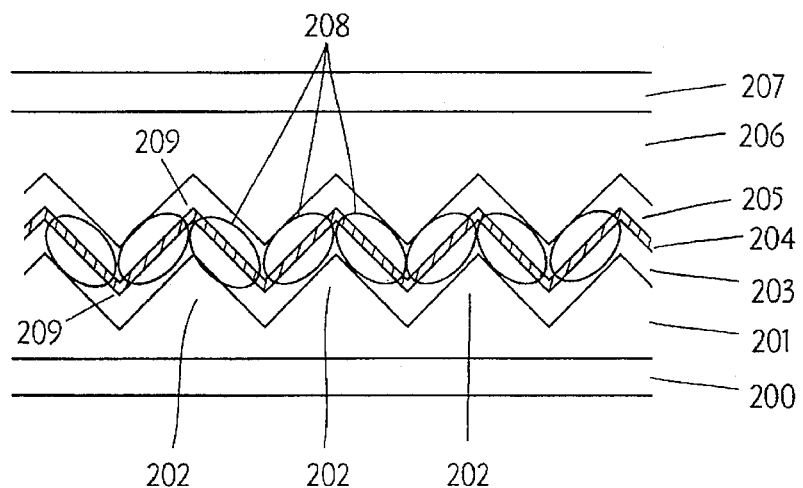
FIG. 2 is a cross-sectional view showing the second example of a quantum wire structure according to the present invention.

FIG. 2 is a cross-sectional view showing a second example of a quantum wire structure. In this example, the quantum wire structure according to the present invention is applied to an active layer of a semiconductor laser device. This quantum wire structure comprises an n-GaAs substrate 200, an n-AlGaAs cladding layer 201 having a thickness of 1.5 μm, a lower AlGaAs-GRIN (Graded Index) layer 203 having a thickness of 70 nm, a GaAs quantum wire layer 204 having a thickness of 7 nm, an upper AlGaAs-GRIN layer 205 having a thickness of 70 nm, a p-AlGaAs cladding layer 206 having a thickness of 1.5 nm, and a p-contact layer 207 having a thickness of 0.7 μm.

A periodical unevenness 202 having a sawtooth shape is formed on the surface of the n-AlGaAs cladding layer 201. The unevenness 202 is formed by electron beam lithography and etching using a hydrochloride type solution so as to have a period of 60 nm and a depth of 30 nm. The AlGaAs-GRIN layer 203 is formed so that the composition is successively varied from $Al_{0.7}Ga_{0.3}As$ to $Al_{0.3}Ga_{0.7}As$ in the direction from the n-AlGaAs cladding layer 201 to the GaAs quantum wire layer 204. The AlGaAs-GRIN layer 205 is formed so that the composition is successively varied from $Al_{0.7}Ga_{0.3}As$ to $Al_{0.3}Ga_{0.7}As$ in the direction from the p-AlGaAs cladding layer 206 to the GaAs quantum wire layer 204. In this case, as a method for growing crystals, a gas source MBE method is used so as to reflect faithfully the unevenness 202 on the GaAs quantum wire layer 204.

Similar to the first example, the thickness of the GaAs quantum wire layer 204 is sufficiently smaller than the de Broglie wavelength of the electron wave, and the radius of curvature of the curved portions 209 of the GaAs quantum wire layer 204 is 20 nm. Because of this, an electron wave is confined in the flat portions 208 of the GaAs quantum wire layer 204. It is noted that a similar configuration can be found in the quantum wire structure using unevenness of the substrate described in the prior art; however, in the case of such a conventional example, the electron wave is confined in the curved portions of the quantum wire layer because of the relatively large thickness (about 10 nm or more) of the quantum wire layer. As a result, the one-dimensional electron as found in the present invention cannot be realized.

In the second example, the characteristics of the quantum wire structure are determined by three parameters including the types of materials used for the quantum wire layer 204 and the GRIN layers 203 and 205, and the width of the flat portions of the quantum wire layer 204. In the second example, the periodical unevenness 202 has a shape stipulated by a crystal face orientation, so that the width of the flat portions 208 becomes 0.7 times the period and the period itself becomes a parameter. These parameters can be readily regulated compared with the layer thickness or shape of the curved portions in growing crystals. Thus, the characteristics of the quantum wire structure produced can be obtained as designed. Accordingly, the controllability and reproducibility of the energy level of the electron confined in the quantum wire layer are satisfactory.

As described above, according to the present invention, a quantum wire structure having satisfactory controllability, reproducibility and productivity can be realized.

EXAMPLES 3, 4, and 5

Figure 3:
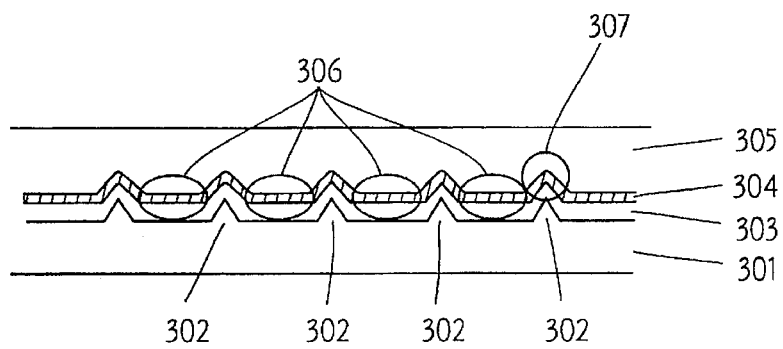
FIG. 3 is a cross-sectional view showing the third example of a quantum wire structure in which a quantum wire is arranged on a flat face according to the present invention.

Next, the case in which the quantum wire is arranged on a flat surface will be described. FIG. 3 is a cross-sectional view showing the third example of a quantum wire structure.

The quantum wire structure includes barrier layers 303 and 305 formed by growing crystals on a wafer 301 having periodical unevenness 302 and a quantum wire layer 304 having a thickness of 7 nm. The periodical unevenness 302 had a triangular shape with a height of 20 nm and a base width of 20 nm, and each triangle is disposed at a distance of 70 nm apart. The quantum wire layer 304 had the same shape as that of the unevenness 302. The width of the flat portions 306 of the quantum wire layer 304 is 50 nm, and each of the radius of curvature of curved portions 307 thereof is 15 nm, wherein these curved portions 307 comprise upper curved portion and lower curved portion, and the length of a portion (curvature=0) between the upper curved portion and the lower curved portion is very small (10 nm or less). Thus, the preferred conditions (see the first example) under which the electron wave is confined in the flat portions 306 are satisfied. Accordingly, in the present example, the structure in which the quantum wire 304 is arranged on a flat face can be realized.

Figure 4:
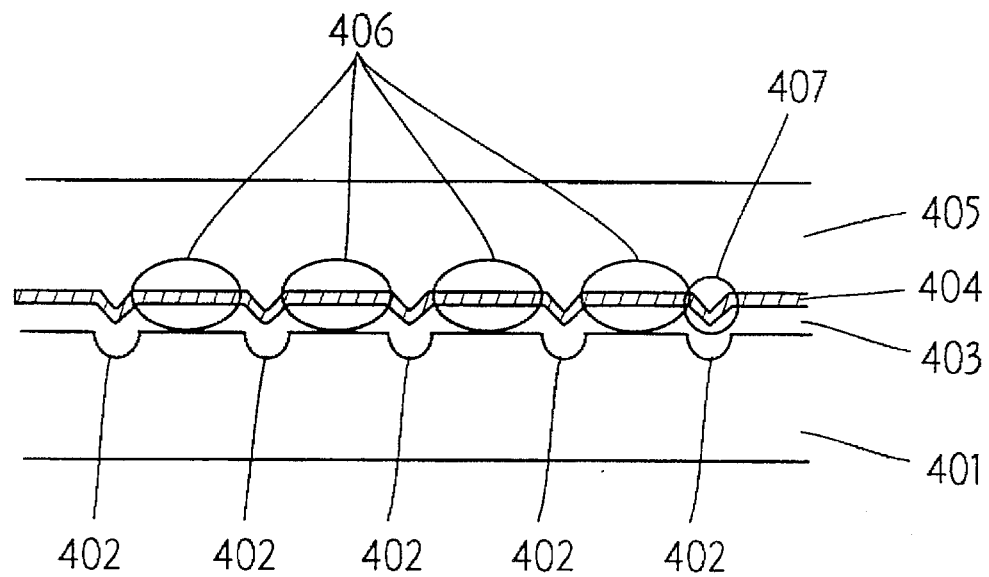
FIG. 4 is a cross-sectional view showing the fourth example of a quantum wire produced on a plurality of periodical grooves according to the present invention.

As is exemplified in the fourth example shown in FIG. 4, the quantum wire structure can be realized by using a quantum wire layer produced on a plurality of periodical grooves. This grooved structure can be formed by electron beam lithography and wet etching using a negative type resist and comprises barrier layers 403 and 405 and a quantum wire layer 404 with a thickness of 5 nm which are formed by growing crystals on a wafer 401 with a periodical grooved structure 402. Moreover, the periodical grooved structure 402 comprises semi-circles with a height of 20 nm and a base width of 20 nm, and each semi-circle is disposed at a distance of 70 nm apart. The quantum wire layer 404 itself has the similar shape to that of the periodical grooved structure 402. That is, a width of a flat portion 406 of the quantum wire layer 404 is 50 nm and a radius of curvature of curved portions 407 is 15 nm, which satisfy the conditions under which electron wave is confined in the flat portion 406. In the third and fourth examples, as in the first and second examples, the parameters which determine the movement of the electron are the width of the flat portions, the size and shape of the unevenness corresponding to the curved portions, and the composition of crystalline materials which are formed on the unevenness. These parameters can be readily regulated as in the first and second examples, and the quantum wire structure can be produced as designed. As described, in Examples 3 and 4, since a quantum wire is realized in the flat portions (306/406), it is not required to use a special growing mechanism in the curved portion.

Thus, the layer thickness, crystal composition, and width (width of the flat portion) of the quantum wire are readily regulated.

Figure 5:
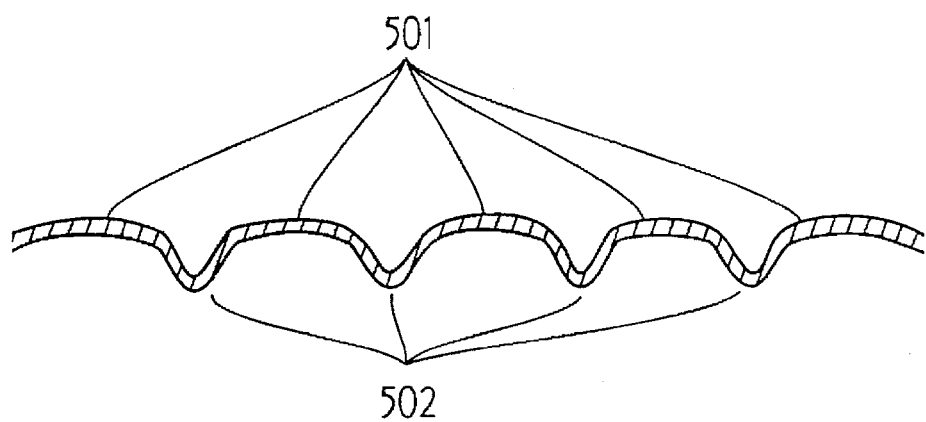
FIG. 5 is cross-sectional view showing the fifth example of a quantum wire structure having a relatively small curvature according to the present invention.

In the quantum wire structures described above with respect to the first through fourth examples, the portions where the electron wave is confined are substantially flat; however, the completely flat portions are not necessary for forming a quantum wire. For example, as in the fifth example shown in FIG. 5, the same effects can be obtained even in the configuration that portions 501 having a small curvature and curved portions 502 having a large curvature (although appearing relatively flat in FIG. 5) exist alternately. The conditions required of the curved portions 502 are the same as the examples described above. The portions 501, in which the electron is confined, should be curved to such an extent that a transverse mode of the electron wave can be varied. More specifically, the radius of curvature of the portions 501 should be sufficiently lager than the de Broglie wavelength of the electron wave. That is, it is preferred that the radius of curvature of the portions 501 is 200 nm or more, and the width thereof is 50 nm (the de Broglie wavelength) or less.

The present invention is not limited to the abovementioned examples and the same effects can also be obtained in the following cases.

(1) The case in which materials such as InGaAsP/InP type, InGaAs/AlGaAs/GaAs strain type, and InGaAlP/GaAs type are used for forming the quantum wire structure instead of GaAs/AlGaAs.

When InGaAsP/InP is used as a material system, InGaAsP or InGaAs can be used as a quantum wire layer, and InGaAsP or InP can be used as a barrier layer.

When InGaAs/AlGaAs/GaAs is used as a material system, InGaAs can be used as a quantum wire layer, and AlgaAs or GaAs can be used as a barrier layer.

Moreover, when InGaAlP/GaAs is used as a material system, InGaP or InGaAlP can be used as a quantum wire layer, and InGaAlP can be used as a barrier layer.

Even any one of the above is combined, it is required that the forbidden band width of the quantum wire layer material is smaller than that of the barrier layer.

(2) The case in which the shape of a semiconductor layer forming the quantum wire is different; for example, the width of the flat portions and/or the curvature of the curved portions can be different. In addition, the thickness of each layer can be different, although preferably in the range such that the abovementioned conditions are satisfied.

(3) The case in which the method for growing crystals is different from that of the examples.

As is apparent from the above description of the examples, according to the present invention, the quantum wire structure can be produced with satisfactory controllability, reproducibility, and in-plane uniformity, and the quantum wire structure can be realized as designed. When this quantum wire structure is applied to various devices, it is expected that semiconductor laser devices, electron running devices, or the like having remarkably improved characteristics can be realized.

It is understood that various other modifications will be apparent to and can be readily made by those skilled in the art without departing from the scope and spirit of this invention. Accordingly, it is not intended that the scope of the claims appended hereto be limited to description as set forth herein,. but rather that the claims be construed as encompassing all the features of patentable novelty that reside in the present invention, including all features that would be treated as equivalents thereof by those skilled in the art to which this invention pertains.

What is claimed is:

1. A quantum wire structure comprising:

a periodic uneven structure formed on a surface of a semiconductor material, the periodic uneven structure including a plurality of flat portions which includes at least one sloped flat portion;

a first layer having a thickness smaller than a de Broglie wavelength of an electron wave in a medium, the first layer having a shape substantially corresponding to the shape of the periodic uneven structure so as to include a plurality of flat regions which include at least one sloped flat region which exists on the at least one sloped flat portion of the periodic uneven structure; and a second layer and a third layer which are disposed on opposite sides of the first layer and respectively have a forbidden band width larger than that of the first layer, wherein a width of each of the plurality of flat portions of the periodic uneven structure is 50 nm or less, and wherein electrons are confined in each of the plurality of the flat regions including the at least one sloped flat region of the first layer.

2. A quantum wire structure according to claim 1, wherein said first layer comprises GaAs, InGaAsP, InGaAs, InGaP or InGaAlP.

3. A quantum wire structure according to claim 1, wherein said second and third layers comprise AlGaAs, InGaAsP, InP, GaAs or InGaAlP.

4. A quantum wire structure according to claim 1, wherein said first layer comprises GaAs, and said second and third layers comprise AlGaAs.

5. A quantum wire structure according to claim 1, wherein said first layer comprises InGaAsP or InGaAs, and said second and third layers Comprise InGaAsP or InP.

6. A quantum wire structure according to claim 1, wherein said first layer comprises InGaAs, and said second and third layers comprise AlGaAs or GaAs.

7. A quantum wire structure according to claim 1, wherein said first layer comprises InGaP or InGaAlP, and said second and third layers comprise InGaAlP.

8. A quantum wire structure according to claim 1, wherein said structure further comprises a substrate.

9. A semiconductor laser device comprising said quantum wire structure according to claim 1.

10. A quantum wire structure according to claim 1, wherein the periodic uneven structure is a mesa stripe-shaped structure, and the plurality of flat portions of the mesa stripe-shaped structure further includes:

at least one upper flat portion; and at least one lower flat portion which is provided at a different positional level from the upper flat portion, the at least one sloped flat portion being located between the upper flat portion and the lower flat portion, and wherein the plurality of the flat regions of the first layer further includes at least one upper flat region and at least one lower flat region respectively corresponding to the at least one upper flat portion and the at least one lower flat portion of the periodic uneven structure.

11. A quantum wire structure according to claim 1, wherein the periodic uneven structure is a sawtooth structure, the plurality of flat portions of the sawtooth structure including a plurality of sloped flat portions, and wherein the plurality of the flat regions of the first layer includes a plurality of sloped flat regions respectively corresponding to the plurality of sloped flat portions of the periodic uneven structure.

12. A quantum wire structure according to claim 1, wherein the periodic uneven structure further comprises a plurality of curved portions between the flat portions, and the first layer further comprises a plurality of curved regions respectively corresponding to the plurality of curved portions of the periodic uneven structure, each of the plurality of curved portions being steep enough so that the electron wave in the first layer exudes from the curved regions of the first layer into the second and third layers.

13. A quantum wire structure according to claim 1, wherein electron confinement in each of the plurality of the flat regions has in-plane uniformity.

14. A quantum wire structure according to claim 13 wherein an energy level of the electrons in the flat regions including the at least one sloped flat region of the first layer, corresponding to quantum wires, has in-plane uniformity.

15. A quantum wire structure according to claim 1, wherein each of the plurality of the flat regions of the first layer has a width which is substantially on the order of the de Broglie wavelength of the electron wave.

16. A quantum wire structure comprising:

a periodic uneven structure formed on a surface of a semiconductor material, the periodic uneven structure including a plurality of flat portions;

a first layer having a thickness smaller than a de Broglie wavelength of an electron wave in a medium, the first layer having a shape substantially corresponding to the shape of the periodic uneven structure so as to include a plurality of flat regions; and a second layer and a third layer which are disposed on opposite sides of the first layer and respectively have a forbidden band width larger than that of the first layer, wherein each of the plurality of the flat regions has a width which is substantially on the order of the de Broglie wavelength of the electron wave.

17. A quantum wire structure according to claim 16, wherein a height of the periodic uneven structure is about 30 nm or less.

18. A quantum wire structure according to claim 16, wherein the width of each of the plurality of the flat regions is about 50 nm or less.

* * * * *